US005294896A

United States Patent [19]

Kjellander, deceased et al.

[11] Patent Number: 5,294,896

[45] Date of Patent: Mar. 15, 1994

[54] DEVICE FOR FEEDING A HIGH FREQUENCY OSCILLATING TOOL

[75] Inventors: Jan Kjellander, deceased, late of Älta, by Elisabeth von Malmborg-Kjellander, legal representative; Thord Nilsson, Järna; Jan Lundberg, Enskede, all of Sweden

[73] Assignee: Diprofil AB, Hagersten, Sweden

[21] Appl. No.: 856,079

[22] PCT Filed: Nov. 12, 1990

[86] PCT No.: PCT/SE90/00730

§ 371 Date: Jul. 13, 1992

§ 102(e) Date: Jul. 13, 1992

[87] PCT Pub. No.: WO91/07237

PCT Pub. Date: May 30, 1991

[30] Foreign Application Priority Data

Nov. 13, 1989 [SE] Sweden ............................ 8903804-6

[51] Int. Cl.[5] ............................ B06B 1/02; H03L 7/00

[52] U.S. Cl. .................................... 331/158; 310/317; 318/116; 331/177 R; 331/181; 366/116

[58] Field of Search ............ 331/116 R, 116 FE, 158, 331/177 R, 181; 310/314, 317; 318/114, 116; 366/116

[56] References Cited

U.S. PATENT DOCUMENTS 4,168,916 9/1979 Yamada et al. .................... 366/116
4,965,532 10/1990 Sakurai .......................... 331/158 X
4,970,656 11/1990 Lo et al. ......................... 318/116 X

FOREIGN PATENT DOCUMENTS 137309 2/1978 Denmark .
0270819 6/1988 European Pat. Off. .
WO85/02106 5/1985 PCT Int'l Appl. .

*Primary Examiner*—Siegfried H. Grimm
*Attorney, Agent, or Firm*—Burns, Doane, Swecker & Mathis

[57] ABSTRACT

This invention relates to an arrangement for driving a high-frequency oscillating tool arrangement (1) which includes, inter alia, a device (1a) whose form changes with a change in voltage, utilizing an electric drive circuit (2) constructed to generate alternating voltage which can be connected to the device and the frequency of which is adapted, through a first control circuit (7), to a value (C1, L1) which momentarily corresponds to the resonance frequency of the reactive element which varies during a working operation. The first control circuit (7) is constructed to control momentary frequency in dependence on momentary phase difference between the current and voltage values of the alternating voltage. A second control circuit (4) is intended to control an inductive element (12) included in an oscillation circuit having a capacitive element (C2) corresponding, inter alia, to the form-changing device, such that the inductive element (C2) will obtain a value (1a) which corresponds to resonance for the prevailing alternating voltage frequency.

5 Claims, 2 Drawing Sheets

DEVICE FOR FEEDING A HIGH FREQUENCY OSCILLATING TOOL

TECHNICAL FIELD

The present invention relates to a system for driving a tool arrangement which oscillates at high frequency, and then particularly to a system for driving a tool tip which is intended for working a workpiece and which oscillates at high frequency and which can exhibit a resonance pattern when driven with the aid of an alternating voltage to which a particular frequency is assigned, a so-called resonance frequency.

Tool configurations which include readily attached and detached tool tips of the aforedescribed kind are previously known and include a device, such as a piezoelectric crystal, which changes form when subjected to changes in the voltage and in which the crystal is influenced by an electric drive circuit which is constructed to generate an alternating voltage whose frequency normally lies within the range of 20–40 kHz.

Tool configurations of this kind normally include a holder or handle which surrounds the crystal and holds the crystal firmly clamped, and to which there can be fitted a tool tip, such as a chisel, a file, grinding meant and the like, by means of which a workpiece can be worked and which are intended to be moved reciprocatingly during the actual working process.

BACKGROUND ART

Each tool arrangement of the aforesaid kind intended for driving a high-frequency oscillating machine tool comprising one or more crystals which change their form when subjected to a change in voltage and which are incorporated in a tool holder and which utilize an electric drive circuit constructed to produce an alternating voltage which can be applied to the crystal, is fitted with a tool tip.

As a result of its construction, the material from which it is made, and its size and shape, each such tool tip, has a resonance frequency at which the energy losses are low. However, when pressure is brought to bear on the tool tip as it performs work, the resonance frequency will change momentarily and consequently there have been proposed various control circuits or regulating circuits (first control circuits) which strive to cause the high frequency oscillation or the alternating voltage applied to the crystal to lie in a momentary resonance frequency. In principle, the resonance frequency is determined electrically by two parallel-connected electrical oscillation circuits, where a first resonance circuit can be considered to constitute a capacitance and an inductance value which is dependent on the extent to which the tool tip is loaded, and therewith varies in time, and where a second resonance circuit can be considered to comprise a substantially fixed capacitance belonging to or related to the crystal and a substantially fixed inductance incorporated in the drive circuit.

It is also known that a given change in resonance frequency will occur as a result of operating conditions and when the tool tip is loaded. This change is normally of such small magnitude that the aforesaid second resonance circuit, with said fixed inductance, will still function very effectively provided that the tool tip is suitably adapted to a selected resonance frequency and provided that the operating conditions are suitably selected within narrow limits.

It has also been proposed to use a frequency controllable supply voltage whose frequency can be adapted to momentary resonance frequencies, by using a first control circuit.

Previously known constructions of this kind enable frequency to be controlled or regulated within narrow limits, say +/−2 kHz, since one control circuit, constructed to detect and regulate towards a fixed minimum impedence, can readily slide over resonance criteria (100 at FIG. 6B) and when detecting and regulating towards a prevailing phase position, between the current and voltage values, there is no positive impedence phase around the series resonance (200 and 200' at FIG. 6B and 6C).

It has been found, however, that when such a drive circuit construction is used at very high loads and/or at prevailing idling frequencies which lie adjacent the resonance frequency and at moderate load, there is risk that the resonance frequency will be changed to such an extent as to inactivate the drive circuit.

It is also known that the exchange of one tool tip for another will normally change the impedence value of the tool arrangement, such as resistance value, capacitance value and/or inductance value included in the first oscillation circuit, to such an extent that the resonance oscillation frequency will lie in the marginal range of said function or completely outside said range, resulting in a functional deficiency. By this is meant that the minimum impedence frequency is separate from the series resonance frequency, which makes it difficult to follow the changes in the series resonance frequency.

It is difficult, if not impossible, to regulate the frequency of the supply voltage with the aid of prior known techniques, such that said frequency will comply with a resonance frequency applicable to the changed resonance frequencies of the two parallel-connected oscillation circuits.

It is known that a drive circuit of the aforesaid kind, functioning to drive a tool arrangement which oscillates at resonance frequency, incorporating a fixed inductance, will permit a frequency change of about +/− 2 kHz around the resonance frequency before the requisite coaction between drive circuit and tool ceases to take place.

None of the earlier known constructions of this kind incorporate means for switching between a high-power-state, for operating the tool tip, and a low-power-state, for "stand-by" function or preparatory function.

DISCLOSURE OF THE PRESENT INVENTION

Technical Problems

When considering the earlier standpoint of techniques as described above, and when considering the technical considerations that have earlier been the guiding influence for one of normal skill in this technical field, it will be seen that in the case of an arrangement for driving a high-frequency oscillating tool arrangement which includes, inter alia, a device (crystal) whose form changes with changes in voltage, and in which there is used an electric drive circuit which is intended to apply to said device or said crystal an alternating voltage whose frequency is adapted, via a first control circuit, to a value which corresponds momentarily to the resonance frequency of the reactive element which varies during operation and during a working process, a technical problem resides in realising the significance of utilizing as a control parameter for the first control circuit the momentary phase difference between the prevailing current and voltage values with respect to said alternating voltage.

A more qualified technical problem will be seen to reside in realizing of the significance of being able to use a further control circuit, a second control circuit, for maintaining a second resonance circuit in resonance, irrespective of the prevailing alternating voltage frequency.

Still a more complex technical problem is one of realising the suitability of permitting the second control circuit to control an inductive element incorporated in an oscillation circuit (second oscillation circuit) having a capacitive element which corresponds to the tool arrangement concerned, such that the second oscillation circuit will remain in resonance for the prevailing alternating voltage frequency, wherewith the first control circuit is able to control the alternating voltage frequency such that the first oscillation circuit will tend to be in resonance, despite the changes in impedence value caused by the operating conditions, and particularly in spite of the changes in the capacitance and/or inductance values of the capacitive and/or the inductive element.

When considering the earlier standpoint of techniques, as described above, it will also be seen that a technical problem resides in the provision of a control circuit by means of which an inductance value incorporated in the second oscillation circuit can be automatically and adaptively adjusted in dependence on frequency, so as to provide an automatic and adaptive resonance, valid in combination with the resonance frequency valid for the first resonance circuit, having impedence values, such as capacitance and/or inductance values which vary with the operating conditions.

Another technical problem is one of realising that, from an electrical aspect, a high-frequency oscillating tool can be considered as two parallel-connected oscillation circuits where the magnitudes (impedence value, capacitance value, inductance value and resistance value) of the oscillation circuits can be varied by different criteria, and on the basis of this realisation to realise that the first control circuit can be constructed for a much larger frequency spectrum when the first control circuit is able to cause the changes in the resonance frequency of the first oscillation circuit to produce a corresponding change in the frequency of the supply voltage, while the second oscillation circuit is guided and adapted to be in resonance, essentially irrespective of the prevailing alternating voltage frequency.

A further technical problem is one of realising the advantages that are afforded when the aforesaid second oscillation circuit includes a simple, adjustable inductance whose value is constantly adapted to the prevailing series resonance frequency and the alternating voltage frequency.

Another technical problem is one of realising that a change in supply voltage frequency to a prevailing resonance frequency value can be readily achieved when the timewise zero crossings of the current and voltage curves are permitted to form regulating magnitudes in the first control circuit.

It will also be seen that in the case of a tool arrangement of the aforedescribed kind, a technical problem resides in realising those advantages that are associated with the provision of a purely vibration tool mode, and that this mode can be obtained by adjusting the frequency to phase similarlity with the current and voltage curve, in combination with perfect adaptation.

Another technical problem in this regard is one of realising that the necessary adaptation of the two parallel-connected resonance circuits can be achieved primarily by controllably changing the frequency towards resonance in the first resonance circuit through the first control circuit, in accordance with the operating conditions, and therewith, and in dependence thereon, change said adjustable inductance value towards resonance or full adaptation of the second resonance circuit.

Another technical problem is one of enabling the ready use of an adjustable and adaptable inductance included in the second oscillation circuit, and therewith realise the advantage that when the resonance frequency in the first resonance circuit is changed automatically by wear in the tool used, the first control circuit will accompany this slow change in resonance frequency and the resonance frequency change caused by the actual working conditions or momentary operation conditions, without the control circuit becoming inoperative.

When considering the earlier standpoint of techniques, as described above, it will be seen that a further technical problem resides in the provision of a second control circuit which will enable the inductance value to be controllably adapted to changes in the tool resonance frequency of such large magnitudes that the resonance circuit will be in resonance, even though the tool frequency should decrease or increase far beyond the earlier known range of +/−2 kHz.

It will also be seen that a technical problem is one of creating conditions, with the aid of simple means, such that both of the resonance circuits will be in resonance, even when the frequency shifts are as large as +/−5 kHz, and preferably above +/−10 kHz.

It will also be seen that a technical problem is one of realising that this adapted adjustment of the inductance value can be achieved with the aid of a transformer which is saturated to different degrees through a d.c. supply, and therewith exhibits different inductance values corresponding to prevailing resonance frequencies.

It will also be seen that a technical problem within this technical field is one of realising the significance of using a transformer having a centre leg and of supplying the direct current to one of the legs and utilizing, in a known manner, the fact that an increasing degree of saturation will decrease the inductance in remaining windings, which are preferably connected in series.

A further technical problem is one of realising the advantages afforded when the first electrical control circuit includes first means operative to determine the phase position of the current and voltage curves in the alternating voltage supplied to the tool arrangement, and to utilize second means for generating frequency changes in the alternating current applied to the tool, such as to generate a new resonance-creating frequency value.

Another technical problem is one of realising the simplifications and improved adjustment possibilities, from a technical coupling aspect, that can be achieved when utilizing the fact that the current and voltage curves will be in phase with one another even in a complex resonance circuit which oscillates at resonance frequency, and also by locking the resonance frequency at a value at which the prevailing current and voltage values are in phase, and adjusting the frequency value up or down, immediately the current and voltage values are-driven out of phase in a predetermined direction or sense.

It will also be seen that a technical problem is one of realising that said second means shall include two known phase-locking loops and that these two phase-locking loops shall be counter-connected so as to enable the internal, frequency-dependent phase shifts of the loops to be eliminated, thereby enabling an evaluated time difference between the zero crossings or phase difference of the voltage and current values to be formed, therewith to generate a changed frequency from the one loop.

When considering one or more of the aforementioned technical problems, it will be seen that a technical problem resides in realising those circuitry simplifications which can be achieved when the necessary variations in energy supplied to the tool are effected by solely regulating prevailing voltage levels up and down, therewith to maintain a constant particle speed for the tool tip concerned and the prevailing series resonsance.

When considering the technical contemplations which have succeeded in providing a solution to one or more of the aforesaid technical problems, a still more complicated technical problem is one of realising that one or more of the proposed solutions actually form the basis on which a low energy consuming "stand-by" facility or preparatory facility can be provided with the aid of simple means, this facility reducing the energy consumption of the tool and lowering internal heating of said tool.

A further technical problem resides in providing this "stand-by" facility with the aid of very simple circuit means and with an automatic cut-in and cut-out function.

Still a further technical problem is one of realising that with the aid of simple circuit means, the standby function can be initiated solely by applying the tool tip to a material or an underlying surface, since this will cause a change in resonance which controls the activation of a high energy level.

It will also be seen that a technical problem is one of realising the advantages afforded by evaluating a predetermined time period over which no adjustment has been made and utilizing this circumstance as an indication that the tool arrangement has not been used and therewith control the drive circuit such that the tool is switched to a lower level of energy input.

Another technical problem is one of realising the significance of generating sufficient energy to drive the tool in resonance frequency when deactivating, so that the drive circuit will not be deactivated when switching-on.

It will also be seen that a technical problem is one of driving a high-frequency oscillating tool arrangement of high efficiency with the ability of providing large changes in resonance frequency while nevertheless creating conditions which will enable the two resonance circuits to operate within a frequency range for a common resonance frequency.

It will also be seen that in the case of a circuit arrangement which has successfully solved one or more of the aforesaid technical problems, a further technical problem resides in the provision of conditions such that when starting the high-frequency oscillating tool arrangement, the drive circuit can be set to a fundamental frequency or resonance frequency adapted to idling conditions and therewith create conditions whereby the regulatable inductance value can be adapted so that the set resonance frequency will occur and be valid for the second resonance circuit.

It will also be seen that a technical problem resides in the provision of a simple, automatic amplifying circuit which is based on the assumption that the current delivered to the tool shall be constant.

Finally, it will be seen that a technical problem resides in the provision of an inductance which belongs to a self-adapted drive circuit such as to achieve a purely vibrational mode and power adaptation of the tool, by automatically adjusting the inductance value to the prevailing resonance frequency, and also of realising the advantages that are afforded by the use of dual-connected phase-locking loops which, when the tool is started-up, will automatically generate the resonance frequency for the tool working and control point.

SOLUTION

For the purpose of solving one or more of the aforesaid technical problems, the present invention provides an arrangement for driving a high-frequency oscillating tool arrangement, and then particularly the use of a tool arrangement of the kind which includes, inter alia, a device, in the form of a crystal, which changes form when subjected to a change in voltage, and the use of an electric control circuit which is constructed to generate an alternating voltage which can be applied to said device and the frequency of which is adjusted, through a first control circuit, to a value which corresponds momentarily to the resonance frequency of the reactive element which varies during operation and/or a working operation.

In accordance with the present invention, the first electrical control circuit is constructed so as to control momentary or instantaneous frequency in response to the momentary or instantaneous phase difference between the prevailing current and voltage values of said alternating voltage.

A second control circuit is provided for controlling the momentary or instantaneous inductance value of an inductive element included in an oscillation circuit with a capacitive element corresponding, inter alia, to the form-changing device and having a (fixed) capacitance value, such that a prevailing alternating voltage frequency will impart to the inductive element an inductance value which corresponds to resonance at momentary frequency.

As preferred embodiments within the scope of the inventive concept, a first resonance circuit whose inductance and capacitance values vary in dependence on momentary operating conditions of the tool arrangement is intended to be supplied with an alternating voltage whose frequency value can be varied by means of a momentary resonance frequency value applicable to the first resonance circuit, and an adjustable inductance included in a second resonance circuit is adjusted to a frequency dependent value which, together with a capacitance value assigned to the tool, gives resonance at the resonance frequency of the first resonance circuit.

It is also proposed that the first control circuit will so regulate the frequency of a Supply voltage that said frequency conforms with the resonance frequency of the momentary inductance and capacitance values valid for the first resonance circuit, whereas adjustment of the adjustable inductance value of the second resonance circuit is effected automatically towards the frequency of the supply value.

The current and voltage values applicable for the supply voltage can be evaluated and their respective phase positions with signs are determinative for increasing or decreasing the frequency of the supply voltage.

If the voltage lies before the current, the frequency is decreased, whereas an increase in frequency takes place when the current lies before the voltage.

The phase position or the time distance between the momentary phase values of the voltage and current, for instance at zero-crossings, constitutes a frequency change control magnitude.

It is also suggested that said adjustment of the inductance value will result, through said second control circuit, in resonance frequencies of the resonance circuit which lie within a frequency variation range greater than 5 kHz around a selected central resonance frequency for the tool arrangement, preferably a frequency variation range greater than 10 kHz.

The inductance value is adjusted with the aid of a transformer which is saturated to different degrees through a controllable direct current supply, and it is particularly proposed that the transformer is configured With a centre leg. The direct current is then supplied to one of the legs, such that an increase in the degree of saturation will result in a decrease in the inductance of remaining windings. The windings will preferably be connected in series.

It is also proposed that the first electrical control circuit will include known first means for determining the phase position of the current and voltage curves of the alternating voltage applied to the tool arrangement, and known second means for generating frequency changes in the alternating current supplied to the tool arrangement.

A generated frequency is intended to lock on a frequency value at which the prevailing current and voltage values lie in phase.

It is also proposed that the first control circuit includes two counter-connected phase-locking loops which will lock to the current and voltage curves when said curves are in phase and pass the zero crossing simultaneously.

Variations in the supply of energy to the tool are effected by solely adjusting the amplitude of the alternating voltage.

It is also suggested that the voltage and/or current connected to the tool arrangement can be supplied in one of a number of energy modes or states, such as a high-energy, tool operating state, and a low energy state intended for a "stand-by" tool function.

The requisite switching between one state and another takes place automatically, subsequent to fulfilling one or more criteria.

One of these criteria may be switching to a lower level, a so-called "stand-by" or preparatory level subsequent to the lapse of a predetermined time period over which no frequency adjustment has been made, thereby to reduce the amount of heat generated in the tool during those times periods in which the tool is not in use.

ADVANTAGES

Those advantages primarily associated with an arrangement in accordance with the invention reside in the creation of conditions which in a complex oscillation circuit comprising two mutually separate resonance circuits, the inductance response can be varied so that the high-frequency oscillating tool arrangement will constantly be supplied by an automatically selected series resonance frequency, irrespective of large changes in resonance frequency caused by the working tool, the type of tip used and the material and/or the load to which it is subjected.

A first control circuit is intended to change the frequency of the supplied alternating voltage towards resonance of a first resonance circuit which includes, inter alia, inductive and capacitive elements whose values are changed with working conditions, and a second control circuit is intended to change the inductance value of the inductive element of a second resonance circuit so that said resonance circuit will be in resonance irrespective of the frequency of the alternating voltage, said second resonance circuit including a capacitive element whose value is changed by a crystal used in said arrangement and only negligibly by the form, material and size of the tool tip used.

Another advantage resides in the ability to supply energy to the tool at a lower level when no such adjustment has been made over a predetermined time period, therewith reducing the generation of heat in the tool over those periods in which the tool is not used.

BRIEF DESCRIPTION OF THE DRAWINGS

A preferred embodiment of an arrangement intended for driving a high-frequency oscillating tool arrangement, intended for working an object, will now be described in more detail with reference to the accompanying drawings, in which.

DESCRIPTION OF EMBODIMENT AT PRESENT PREFERRED

Figure 1:
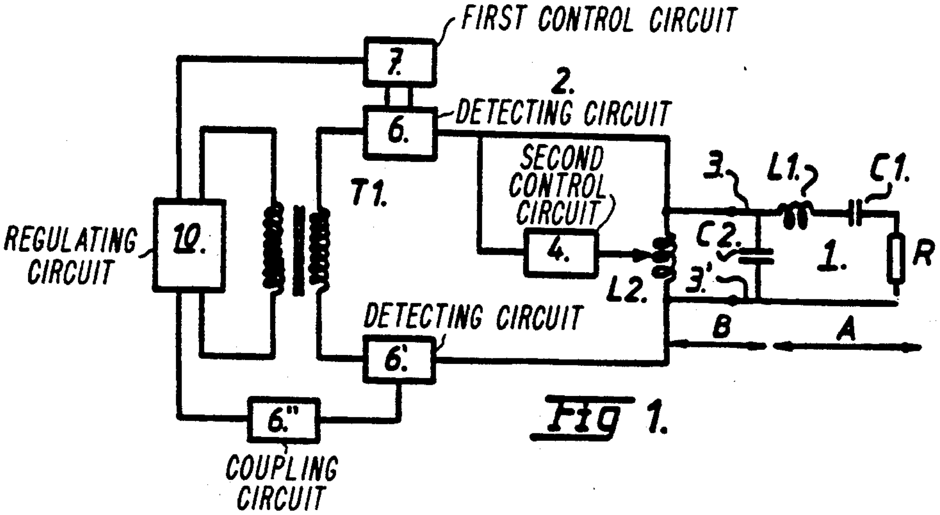
FIG. 1 is a block schematic which illustrates the principle construction of a high-frequency oscillating tool arrangement having connected thereto an electrical drive circuit, shown in a correspondingly simplified form, for driving the high-frequency oscillating tool arrangement, said arrangement including a first oscillation circuit comprising a capacitance and an inductance whose values, inter alia, can be varied in dependence on the working conditions and the material from which the tool tip is made, and a second oscillation circuit which includes a crystal-related capacitance and an inductance which can be influenced by a second control circuit.

FIG. 1 is a block schematic illustrating the principle construction of a high-frequency oscillating tool arrangement I and an electric drive circuit 2 connected to said arrangement.

The tool arrangement I of FIG. 1 is illustrated as an equivalent, simplified electrical circuit diagram and includes a first oscillation circuit C1, L1 and R, where at least the capacitance value of the capacitance C1 and the inductance value of the inductance L1 vary strongly in dependence on the prevailing tool operating conditions, and particularly the tip 1*b* of the tool.

The tool arrangement 1 can also be considered to include a further capacitance C2, whose capacitance value does not vary appreciably with prevailing tip operating conditions, but can be considered to have a constant capacitance value, or at least a substantially constant capacitance value of the crystal structure.

This capacitance C2 is included in a second oscillation circuit C2, L2, where the inductance value of the inductance L2 can be adjusted in a manner described in more detail here below.

The first oscillation circuit C1, L1 (A) is in resonance through frequency adaptation from a first control circuit 7, and the second oscillation circuit C2, L2 (B) is in resonance through inductance-value adaptation from a second control circuit 4, for each momentary frequency applicable for the alternating voltage supplied.

Thus, the oscillation circuit C2, L2 (B) is in resonance irrespective of the momentary alternating voltage frequency applied to the tool or to the first oscillation circuit C1, L1 (A).

The circuit 6 is intended to detect the momentary current and voltage values applicable for the supplied alternating voltage.

The circuit 10 is a regulating circuit which is able to regulate the generated frequency via the transformer T1, in response to a signal obtained from the circuit 7.

A circuit 6' is intended to detect prevailing current values and to send, via a circuit 611, a signal to the circuit 10 which regulates power with constant current value.

Figure 2:
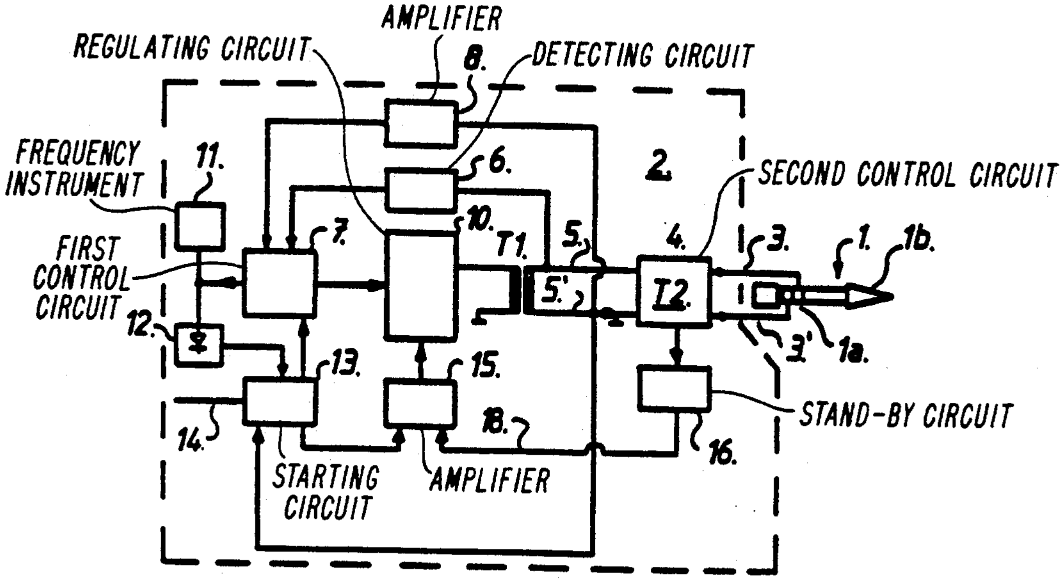
FIG. 2 is a block schematic which illustrates the tool arrangement of FIG. 1 in more detail.

FIG. 2 is a block schematic which illustrates an arrangement for driving a high-frequency, oscillating tool arrangement 1 and an electric drive circuit 2 intended for driving the arrangement 1.

The tool arrangement 1 includes a device 1*a*, in the form of one or more, normally two piezo electric crystals, which changes/change form in response to a change in voltage, and there is used an electric drive circuit 2 which is constructed to apply an alternating voltage to the crystal 1*a* through conductors 3, 3'.

The tool arrangement illustrated in FIG. 2 also includes a tool tip 1*b* which can be readily exchanged for other tips, which then normally produce another resonance frequency.

Since a tool arrangement 1 which includes one or more crystals 1*a* and a readily exchangeable tool tip 1*b* is known to the art, the tool arrangement will not be described in more detail.

The principle construction of the drive circuit 2, according to FIGS. 1 and 2, and a preferred embodiment according to FIGS. 3–5 will now be described.

With reference to FIG. 1, there is first shown an equivalent, simplified electrical circuit for the tool arrangement 1. From an electrical point of view, this circuit can be considered to comprise a resistance R, a capacitance C1 connected in series with an inductance L1, and a capacitance C2 connected in parallel therewith.

The capacitance C1, the inductance L1 and the resistance R form a first oscillation circuit A.

It can be assumed that the capacitance value C1 and the inductance value L1 will vary with the load prevailing on the working tip of the tool, whereas its fundamental value is at least dependent on the form, size and material of the tool tip. It should be noted that the resonance frequency selected will also change slightly as the tool tip becomes worn.

It follows from this that the first oscillation circuit A cannot have constant values in time, but that these values will vary strongly. This means that the adapted resonance frequency will also vary.

It will be readily understood that changes in resonance frequency will occur when the tool tip is applied to material or a workpiece to be worked. A change of tool tip will also normally result in a change in resonance frequency.

From an electrical aspect, this means that the capacitance value C1 and the inductance value L1 will change in time and in dependence on prevailing operating conditions.

The arrangement also includes a second Oscillation circuit B which includes a capacitance C2, the value of which can be considered to be constant or at least substantially constant and will depend on the nature of the crystal 1*a* used in the arrangement. A more detailed description of this is found in "Piezoelectric ceramics" published by Mullard Limited, Torrington Place, London WCIE 7HD, England.

In accordance with the inventive principles, an inductance L2 forming part of an electrical second control circuit in the second oscillation circuit B can be given different inductance values, which can be adjusted in a manner described in more detail herebelow.

The invention is based on the understanding that the two parallel-connected resonance circuits will always operate in a common resonance frequency, irrespective of the resonance frequency changes generated in time by the first resonance circuit, for instance when the tool tip works the material.

Thus, it is known that an uncontrolled change of the capacitance values and/or inductance values of a resonance circuit will result in a correspondingly uncontrolled change in resonance frequency, and in accordance with the present invention., this is considered to apply to the first resonance circuit A.

It is also known that a change in the inductance and/or capacitance value of a resonance circuit as a result of a frequency change can cause the resonance circuit to adapt to resonance, despite the frequency change, and in accordance with the invention, this shall apply to the second resonance circuit B.

Figure 3:
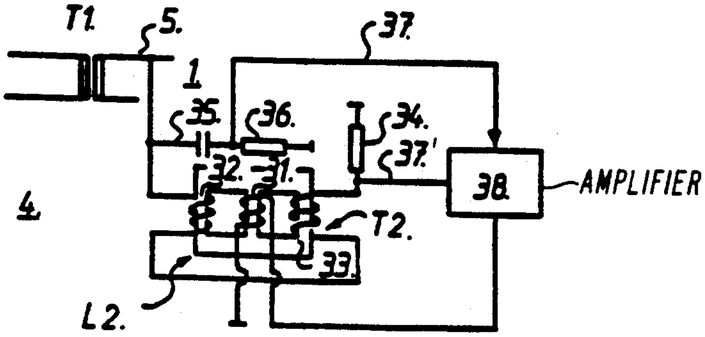
FIG. 3 is a more detailed circuit diagram of a second control circuit illustrated in FIG. 2, said second circuit having the form of a self-adjusting adaptation circuit.

FIG. 3 is a principle diagram of a second control circuit 4 in the form of a self-adjusting adaptation circuit 4 which is intended to change automatically the inductance value L2 of the second resonance circuit B, so that this resonance circuit will be in resonance at each momentarily occurring frequency on the supply line 5, 5' or 3, 31.

The control circuit 4 causes the second resonance circuit B to be constantly in resonance.

In order to provide a variable inductance value L2, there is used a transformer T2 which has three legs. One of these legs, the centre leg, is provided with a d.c. coil 31 which functions to saturate the core to different degrees of saturation and therewith different inductance values (L2) for different frequencies, in response to the value of the current.

It may be suitable to change the core area of certain legs so as to obtain an appropriate inductance value and an appropriate inductance value variation in response to variation and magnitude of the direct current.

The voltage supplied to the tool 1 is connected to earth through the windings 32, 33 on the two outer legs of the transformer T2.

The two series-connected windings 32 and 33 and a resistance 34 of the transformer on the one hand, and a capacitor 35 and a resistor 36 on the other hand, form a bridge coupling. As soon as the bridge coupling produces an output signal on line 37 and line 37' respectively, this signal is amplified in an amplifying circuit 38 and is supplied, (rectified and amplified), to said centre leg and the direct current winding 31.

The voltage values occurring on the conductors 37 and 37' are rectified, whereafter the voltage difference is integrated and utilized to control said current supply or amplifying circuit 38.

Since these circuits are well known, they will not be described in detail.

It should be mentioned, however, that the capacitance value of the capacitance 35 will preferably be equal to the capacitance value of the capacitance C2 divided by a constant k.

The resistor 34 has a resistance value which corresponds to the resistance value of the resistor 36, multiplied by said constant k.

The constant k shall be selected so that the bridge coupling will not influence adaptation.

A positive output signal between conductor 37 and 37' respectively produces an increase in direct current and a negative output signal produces a decrease in direct current, wherein the value of the inductance L2 will be determined by the value of the direct current and will constantly adapt so that the second resonance circuit B is in resonance at a frequency which corresponds to the frequency of the current supplied to the tool.

This resonance frequency applies to a common resonance of the complex resonance circuit which includes an adapted inductance value for the inductance L2 and the capacitance C2 and prevailing values for the inductance L1 and the capacitance C1 which can vary as a result of the operating conditions.

The self-adjusting circuit 4 is thus supplied with a voltage present on the conductors 5, 5', this voltage being further supplied to the crystals 1*a* of the tool arrangement 1, through conductors 3, 3'.

The voltage value occurring on the conductor 5 is detected through a circuit 6 and delivered to the first control circuit 7.

The current value occurring on the conductor 5' is detected and delivered to the first control circuit 7, through a circuit and an amplification S. The control circuit 7 is connected to a drive circuit 10 which supplies the aforesaid transformer T1 through a conductor.

Figure 4:
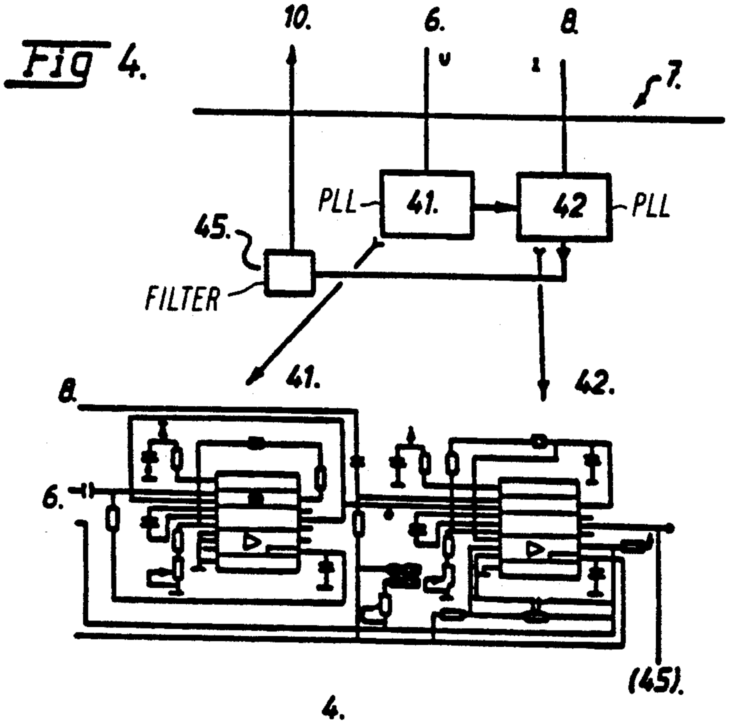
FIG. 4 is a more detailed circuit diagram of the first control circuit illustrated in FIG. 2.

FIG. 4 is a principle diagram of a first control circuit 7 which includes two counter-connected, phase-locking loops. (PLL circuits, Phase Locked Loop circuits) 41 and 42.

Phase locking loops are known to the art, and consequently the operational function of these loops will not be described in detail, although FIG. 4 illustrates a circuit diagram applicable to two counterconnected PLL circuits.

It will be seen that the voltage value is applied to the circuit 41, whereas the current value is applied to the circuit 42.

In the absence of a phase difference between the current and voltage values 5, 5', the circuit 42 delivers a signal whose frequency is filtered in a filter 45 and amplified in the drive circuit 10 and delivered on the conductors 5, 5' as a resonance frequency for the two tuned resonance circuits A and B.

When the tool tip lb is loaded, the resonance frequency of the first resonance circuit A will change and the current and voltage values on the conductors 5, 5' will be in phase with one another.

The amplitude of the voltage and current values occurring on the conductors 5, 5' is limited and amplified to square waves in the circuit 41 and 42 and the time difference is evaluated with signs for respective zero crossings. This time difference and sign generates in the circuit 42 a frequency change for the outgoing signal, via the filter 45 and the drive circuit 10.

This change is selected so that the first resonance circuit A will be in the resonance frequency. The second resonance circuit B automatically adjusts to the new resonance frequency, by changing the value on the inductance L2.

The phase-locking loops or circuits 41 and 42 are so coordinated that there is delivered from the circuit 42 a signal whose value is dependent on the phase difference, and the internal frequency-dependent phase shifts of the phase-locking loops are eliminated through the negative feedback, so that the differences between the voltage and current phases form control signals which controls the frequency of the circuit 42.

The control circuit 7 (according to FIG. 2) is also connected to a frequency instrument 11 and a means 12, which is adapted for repeated starts should phase locking not occur, and which is intended for coaction with a start block 13. This start block 13 is activated with the aid of a signal on a conductor 14.

The self-adjusting adaptation 4 is also connected with a "stand-by" block or preparatory block 16, which is activated by occurrent voltage values. The "stand-by" block 16 is connected with the automatic amplifying circuit 15 through a conductor 18.

Figure 5:
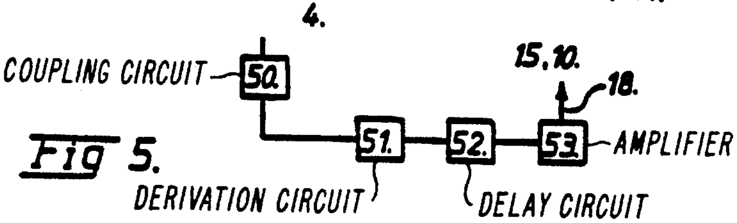
FIG. 5 is a more detailed circuit diagram of a "stand-by" block illustrated in FIG. 2.

FIG. 5 is a principle diagram of a "stand-by" block or preparatory block 16.

It will be seen from FIG. 5 that the regulated voltage by means of which power is supplied to the tool arrangement 1 is applied to a circuit 50 which is connected to a derivation circuit 51, the output of which is connected, through a delay circuit 52 set at a delay of five seconds, to an amplifier 53 included in the circuit 15, this amplifier controlling the supply of current to the tool 1 through the drive unit 10.

It will be evident from this that when the circuits 50 and 51 are supplied with constant voltage, the derivative will be 0 and the signal will then throttle the amplifier 53 so that the drive circuit 10 will supply current which exhibits a value of only 1/10th of the supply current normally required.

In this operational state of the arrangement, the arrangement 1 is supplied with a low level of energy, i.e. is in a low-energy state during those periods of time in which the tool is not in use, although with resonance adaptation of the aforedescribed nature.

It is evident that intiation of the "stand-by" block can be effected with the aid of other control parameters than the aforesaid voltage value.

When the resonance frequency is changed, there is produced on the derivating circuit 51 an output signal which opens the amplifier 53, which changes the amplification in the drive circuit 10 so as to supply full power or operational power.

The invention is based on the realisation that when the drive circuit 2 drives the tool arrangement at a resonance frequency of, for instance, 30 kHz and the tool tip is applied to a workpiece, it can be assumed that the resonance frequency of the one resonance circuit will increase to 33 kHz.

This increase in frequency is normally sufficient to deactivate an earlier known adaptation, although in accordance with the present invention,.the frequency is now increased and the inductance value of the inductance L2 correspondingly adjusted.

Should the work carried out by the tool tip be of such nature as to cause the resonance frequency of one resonance circuit A to fall to a level of 20 kHz for Instance, the inductance value L2 of the second resonance circuit B will be adjusted correspondingly so that this resonance frequency will also lie at 20 kHz.

From a practical aspect, it has been found convenient to adapt adjustment of the inductance value in a manner to give a resonance circuit within a frequency variation range greater than 10 kHz for the tool, practically not larger than 15 kHz.

Figure 6:
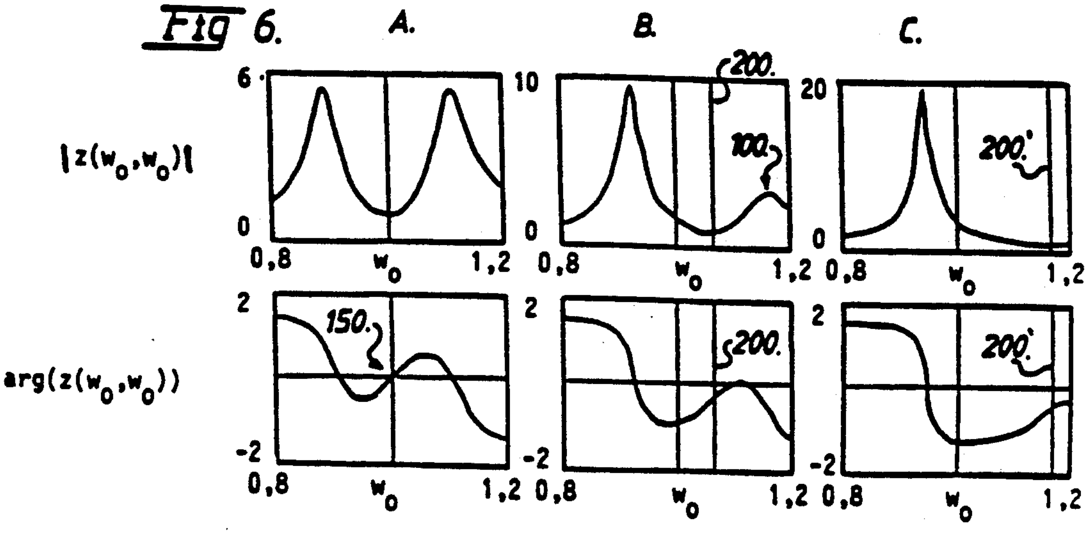
FIG. 6 illustrates a number of process curves and phase curves which are intended to illustrate the inventive regulating function and the regulating function of known control circuits.

FIG. 6A illustrates the process and argument curves as a function of the frequency of 30 kHz for a perfect, parallel-adapted crystal 1*a*.

It will be seen from this Figure that the series resonance frequencies, minimum impedence frequencies and real impedence frequencies coincide and that frequency adjustment can be effected by utilizing the positive value of the derivative at the intersection point 150 applicable to series resonance.

FIG. 6B illustrates the process and argument curves as a function of the frequency of a 30 kHz paralleladapted crystal 1*a* with its series resonance 200 shifted to 32 kHz. The series resonance frequencies, minimum impedence frequencies and real impedence frequencies do not coincide and, consequently, it is impossible to adjust an earlier known drive circuit within limits above say +/−2 kHz.

Finally, FIG. 6C illustrates the process and argument curves as a function of the frequency of a 30 kHz parallel-adapted crystal 1*a* with its series resonance 200′ shifted to 35 kHz. The series resonance frequencies, minimum impedence frequencies and real impedence frequencies do not coincide.

It is seen that in earlier known techniques, no real phase position around the series resonance frequency is obtained for frequencies higher than 32 kHz.

The curves are mirror reversed at frequencies of 28 kHz and 25 kHz respectively.

FIG. 6A illustrates adaptive adaptation within the recited frequency range.

A SUMMARY DESCRIPTION OF THE METHOD OF OPERATION

Starting Sequence

When starting the arrangement, the start block 13 is activated and produces a signal which sets the control circuit 7 to a state in which a central frequency is generated, 30 kHz, while simultaneously lowering the amplification through the circuit 15.

In this way, the adaptive adaptation in the circuit 4 will adjust to a resonance frequency of 30 kHz.

In this operational state, the second resonance circuit B is in resonance.

The start block 13 then relinquishes its influence through the control circuit 7 and the circuit 15.

Complete parallel-adaptation of the two resonance circuits requires adaptation of the resonance frequency of the first resonance circuit A, which is effected by adaptive adaptation of the resonance frequency in accordance with the following.

Adaptive Adaptation

If it is assumed that the first resonance circuit A lies outside the resonance frequency of the second resonance circuit B, automatic adaptation of the frequency is required.

This is effected by detecting the current and voltage values occurring on the conductors 3′ and 5.

These are dampened (8, 6) prior to being delivered to respective circuits 41, 42 (PLL circuits). The circuits 41, 42 evaluate the phase positions of the current and the voltage by establishing the time points of the zero crossings.

If the voltage lies before the current, the frequency is reduced until the phase position "0" occurs.

If the current lies before the voltage, the frequency is increased until the phase position "0" occurs.

The inductance L2 changes automatically with each frequency change, so that the second oscillation circuit will lie in resonance.

The following circumstances should be observed in order to obtain an understanding and interpretation of the characteristics of the invention.

In respect of FIG. 2, a simplification is that, in practice, more than one resonance frequency is found and that the resonance pattern is periodic to the extent that the resonance pattern is repeated periodically during a tool-tip change, or shortening of the tool tip.

The resonance pattern is disturbed by abrupt changes in area, where several standing wave patterns become more or less pronounced, and consequently the tool is preferably constructed with requisite adaptation to this particular circumstance and to the dimensions of the crystal.

When starting-up, the resonance frequency which lies closest to 30 kHz is chosen, but if the Q-value of the series resonance circuit is too low, the adaptive adaptation will select a more stable resonance frequency when load is applied.

It will be understood that the invention is not restricted to the aforedescribed exemplifying embodiment thereof, and that modifications can be made within the scope of the inventive concept illustrated in the following claims.

We claim:

1. A system for driving a high-frequency oscillating tool arrangement (1), which includes; inter alia, a device (1*a*), such as a piezoelectric crystal, whose form will change when subjected to changes in voltage; an electric drive circuit (2), adapted to generate an alternating voltage, which can be applied to said device (1*a*), the frequency of which is given, through a first control circuit (7), a value which momentarily corresponds to the resonance frequency of a first oscillating circuit (C1,L1 and R), representing said device (1*a*) in an equivalent, simplified electrical circuit diagram, in which the reactive elements (L1,C1) vary during a working operation; a second oscillating circuit (C2,L2), wherein the capacitive component (C2) thereof is representing said device (1*a*) in an equivalent, simplified electrical circuit diagram, in which said capacitive component (C2) does not vary appreciable with prevailing tool operating conditions (can be considered to have a constant capacitance value of the crystal structure), and the inductive component thereof is, via a second control circuit (4), given different inductance (L2) values, wherein said first oscillating circuit (CI,LL and R) and said second oscillating circuit (C2,L2) consitute two parallel-connected circuits, said first and said second oscillating circuits are operating in a common resonance frequency mode, characterized in that the inductive component (L2) of said second oscillating circuit (C2,L2) is parallel-connected to its capacitive component (C2), that a required frequency adjustment of the generated alternating voltage towards resonance frequency for the first oscillating circuit (C1,L1) is effectivated by utilizing the positive value of the derivative at an intersection point (150), applicable at said resonance of an argument curve as a function of the frequency, where minimum impedance frequencies and real impedance frequencies coincide, and that the difference (time distance at zero-crossing) between momentary phase values of the voltage and the current constitutes required frequency change control magnitude, for changing the frequency of the generated alternating voltage towards resonance for said first oscillating circuit.

2. A system according to claim 1, characterized in that an adjustment of the inductance value (L2), through said second control circuit (4), is adapted to provide resonance frequencies within a frequency variation range, which is greater than 5 kHz for the tool arrangement.

3. A system according to claim 1, characterized in that the generated frequency is intended to lock on a value, at which the prevailing current and voltage values are in phase.

4. A system according to claim 1, characterized in that said first control circuit (7) includes two counter-connected phase-locking loops (41,42), to lock to the current and voltage curves when these are in phase and pass the zero crossing.

5. A system for driving a high-frequency oscillating tool arrangement (1), which includes, inter alia, a device (1*a*), such as a piezoelectric crystal, whose form will change when subjected to changes in voltage; an electric drive circuit (2), adapted to generate an alternating voltage, which can be applied to said device (1*a*), the frequency of which is given, through a first control circuit (7), a value which momentarily corresponds to the resonance frequency of a first oscillating circuit (CI,L1, and R), representing said device (1*a*) in an equivalent, simplified electrical circuit diagram, in which the reactive elements (L1,C1) vary during a working operation; a second oscillating circuit (C2,L2), wherein the capacitive component (C2) thereof is representing said device (1*a*) in an equivalent, simplified electrical circuit diagram, in which said capacitive component (C2) does not vary appreciably with prevailing tool operation conditions and the inductive component thereof is, via a second control circuit (4), given different inductance (L2) values, wherein said first oscillating circuit (C1,L1 and R) and said second oscillating circuit (C2,L2) constitute two parallel-connected circuits, said first and said second oscillating circuits are operating in a common resonance frequency mode, whereby the voltage and/or the current, connected to the tool arrangement, can be supplied in one of several power states or modes, a high power state intended for operating the tool and a low power state intended as a "stand-by" function of the tool, whereby the requisite for switching between one state and the other is effected automatically subsequent to fulfilling one or more criteria, characterized in that the inductive component (L2) of said second oscillating circuit (C2,L2) is parallel-connected to its capacitive component (C2), that a required frequency adjustment of the generated alternating voltage towards resonance frequency of the first oscillating circuit (CI,L1) is effectivated by utilizing the positive value of the derivative at an intersection point (150), applicable at said resonance of an argument curve as a function of the frequency, where minimum impedance frequencies and real impedance frequencies coincide, that the difference (time distance at zero-crossing) between momentary phase values of the voltage and the current constitutes required frequency change control magnitude, for changing the frequency of the generated alternating voltage towards resonance for said first oscillating circuit, whereby said power supply is witching between operating mode and "stand-by" mode when a predetermined time period has lapsed, during which no adjustment of the voltage or frequency has been made, that said second control circuit (4) is connected to a "stand-by" or preparatory block (16), activated by occurrent voltage values and connected to an automatic amplifying circuit (15), including a derivation circuit (51) and a delay circuit (52), the former, when supplied with a constant voltage, causing the derivative value to go towards "0" and throttling an amplifier (53), causing the drive circuit (10) to generate a signal adapted to "stand-by" mode.

* * * * *